United States Patent
Chepulskyy et al.

(10) Patent No.: US 9,478,730 B2
(45) Date of Patent: Oct. 25, 2016

(54) METHOD AND SYSTEM FOR PROVIDING MAGNETIC LAYERS HAVING INSERTION LAYERS FOR USE IN SPIN TRANSFER TORQUE MEMORIES

(71) Applicant: SAMSUNG ELECTRONICS CO., LTD., Gyeonggi-do (KR)

(72) Inventors: Roman Chepulskyy, Milpitas, CA (US); Dmytro Apalkov, San Jose, CA (US); Alexey Vasilyevitch Khvalkovskiy, Milpitas, CA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 703 days.

(21) Appl. No.: 13/865,445

(22) Filed: Apr. 18, 2013

(65) Prior Publication Data

US 2015/0357556 A1    Dec. 10, 2015

Related U.S. Application Data

(63) Continuation-in-part of application No. 13/011,849, filed on Jan. 21, 2011, now Pat. No. 8,432,009.

(60) Provisional application No. 61/794,692, filed on Mar. 15, 2013, provisional application No. 61/429,041, filed on Dec. 31, 2010.

(51) Int. Cl.
  *G11C 11/56* (2006.01)
  *H01L 29/74* (2006.01)
  (Continued)

(52) U.S. Cl.
  CPC ............. *H01L 43/08* (2013.01); *G11C 11/161* (2013.01)

(58) Field of Classification Search
  CPC .... B82Y 10/00; B82Y 25/00; G01R 33/093; G11B 5/00; G11B 5/3903; H01F 10/3295; H01F 10/3227; H01F 10/3272; H01L 43/10
  USPC ................. 257/E43.004, 200, 421, E29.323; 360/324.12
  See application file for complete search history.

(56) References Cited

U.S. PATENT DOCUMENTS 6,532,164 B2    3/2003  Redon
6,611,405 B1    8/2003  Inomata (Continued)

OTHER PUBLICATIONS

Extended European Search Report for 1186520.0 dated Feb. 2, 2012.

(Continued)

*Primary Examiner* — Kimberly Rizkallah
*Assistant Examiner* — Brian Turner
(74) *Attorney, Agent, or Firm* — Convergent Law Group LLP

(57) ABSTRACT

A method and system for providing a magnetic junction usable in a magnetic device are described. The magnetic junction includes a pinned layer, a nonmagnetic spacer layer, and a free layer. The nonmagnetic spacer layer is between the pinned layer and the free layer. The magnetic junction is configured such that the free layer is switchable between a plurality of stable magnetic states when a write current is passed through the magnetic junction. At least one of the pinned layer and the free layer includes a magnetic substructure. The magnetic substructure includes at least two magnetic layers interleaved with at least one insertion layer. Each of the at least one insertion layer includes at least one of Bi, W, I, Zn, Nb, Ag, Cd, Hf, Os, Mo, Ca, Hg, Sc, Y, Sr, Mg, Ti, Ba, K, Na, Rb, Pb, and Zr. The at least two magnetic layers are magnetically coupled.

18 Claims, 6 Drawing Sheets

(51) Int. Cl.
*H01L 29/82* (2006.01)
*H01L 43/10* (2006.01)
*G11B 5/33* (2006.01)
*H01L 43/08* (2006.01)
*G11C 11/16* (2006.01)

(56) References Cited

U.S. PATENT DOCUMENTS

| | | | |
|---|---|---|---|
| 6,714,389 B1* | 3/2004 | Pokhil | G11B 5/39 |
| | | | 360/324.12 |
| 6,829,161 B2 | 12/2004 | Huai | |
| 6,844,605 B2 | 1/2005 | Nishimura | |
| 6,967,863 B2 | 11/2005 | Huai | |
| 6,992,359 B2 | 1/2006 | Huai | |
| 7,088,609 B2 | 8/2006 | Valet | |
| 7,106,624 B2 | 9/2006 | Huai | |
| 7,161,829 B2 | 1/2007 | Huai | |
| 7,190,611 B2 | 3/2007 | Nguyen | |
| 7,242,045 B2 | 7/2007 | Nguyen | |
| 7,486,551 B1 | 2/2009 | Li | |
| 7,489,541 B2 | 2/2009 | Pakala | |
| 7,502,249 B1 | 3/2009 | Ding | |
| 7,532,505 B1 | 5/2009 | Ding | |
| 7,821,088 B2 | 10/2010 | Nguyen | |
| 7,932,571 B2 | 4/2011 | Rizzo | |
| 2002/0105827 A1 | 8/2002 | Redon | |
| 2003/0007398 A1 | 1/2003 | Daughton | |
| 2003/0059588 A1 | 3/2003 | Hannah | |
| 2003/0168673 A1* | 9/2003 | Yuasa | B82Y 10/00 |
| | | | 257/200 |
| 2003/0227807 A1 | 12/2003 | Nakamura | |
| 2005/0040433 A1 | 2/2005 | Nozieres | |
| 2005/0104101 A1 | 5/2005 | Sun | |
| 2005/0106810 A1 | 5/2005 | Pakala | |
| 2005/0174702 A1 | 8/2005 | Gill | |
| 2006/0291108 A1* | 12/2006 | Sbiaa | B82Y 10/00 |
| | | | 360/324.12 |
| 2008/0008908 A1* | 1/2008 | Ishiwata | B82Y 25/00 |
| | | | 428/811 |
| 2008/0112093 A1 | 5/2008 | Sato | |
| 2008/0230819 A1 | 9/2008 | Nguyen | |
| 2011/0188157 A1* | 8/2011 | Zhao | G11B 5/3906 |
| | | | 360/313 |
| 2012/0153412 A1* | 6/2012 | Doyle | H01L 27/228 |
| | | | 257/421 |

OTHER PUBLICATIONS

Albert, et al., "Polarized Current Switfching of a CO Thin Film Nanomagnet," American Institute of Physics, 77(23):3809-11 (2000).
Berger, "Emission of spin waves by a magnetic multilayer traversed by a current," Physical Review B, 54(13) 9953-58 (1996).
Fromter, "Imaging the cone state of the spin reorientation transition," Physical Review Letters, 100:207202-1-4 (2008).
Katine, et al., "Current-driven magnetization reversal and spin-wave excitations in Co/Cu/Co Pillars," Physical Review Letters, 84(14):3419-52 (2000).
Nishimura, et al., "Magnetic tunnel junction device with perpendicular magnetization films for high-density magnetic random access memory," J.of Applied Physics, 90(8):5246-49 (2002).
Slonczewski, "Conductance and exchange coupling of two ferromagnets separated by a tunneling barrier," Physical Review B, 39(10)L 6995-7002 (1989).
Slonczewski, "Current-driven excitation of magnetic multilayers," J.of Magnetism and Magnetic Materials, 159:L17 (1996).
Slonczewski, "Theory and application of exchange-driven switching," IEEE, pp. CE-02 (2000).
Stillrich, "Magnetic anisotropy and the cone state in Co/Pt multilayer films," J.of Applied Physics, 105:07C308 (2009).
Varga, "Experimental demonstration of non-majority, nanomagnet logic gates," 2009.
Varga, Programmable nanomagnetic-logic majority gate (2010).
PCT International Search Report and Written Opinion of the ISA, Appl.No. PCT/US08/64974.
PCT International Search Report and Written Opinion of the ISA, Appl.No. PCT/US08/66369.
PCT International Search Report and Written Opinion of the ISA, Appl.No. PCT/US10/47941.
PCT International Search Report and Written Opinion of the ISA, Appl.No. PCT/US10/59184.
Office Action issued Apr. 2008 for U.S. Appl. No. 11/239,939.
Office Action issued Jan. 2010 for U.S. Appl. No. 12/133,671.
Office Action issued Apr. 2009 for U.S. Appl. No. 12/133,671.
Office Action issued Mar. 2011 for U.S. Appl. No. 12/638,902.

* cited by examiner

METHOD AND SYSTEM FOR PROVIDING MAGNETIC LAYERS HAVING INSERTION LAYERS FOR USE IN SPIN TRANSFER TORQUE MEMORIES

CROSS-REFERENCE TO RELATED APPLICATIONS

This application claims the benefit of provisional Patent Application Ser. No. 61/794,692, filed Mar. 15, 2013, entitled METHOD AND SYSTEM FOR PROVIDING MAGNETIC LAYERS HAVING INSERTION LAYERS FOR US IN SPIN TRANSFER TORQUE MEMORIES, assigned to the assignee of the present application, and incorporated herein by reference. This application is a continuation-in-part of and claims the benefit of co-pending U.S. patent application Ser. No. 13/011,849 filed Jan. 21, 2011, which claims the benefit of provisional Patent Application Ser. No. 61/429,041, filed Dec. 31, 2010, and is assigned to the assignee of the present application, and incorporated herein by reference.

GOVERNMENT RIGHTS

This invention was made with U.S. Government support under Grant/Contract No. HR0011-09-C-0023 awarded by DARPA. The U.S. Government retains certain rights in this invention.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional magnetic tunneling junction (MTJ) 10 as it may be used in a conventional STT-MRAM. The conventional MTJ 10 typically resides on a bottom contact 11, uses conventional seed layer(s) 12 and includes a conventional antiferromagnetic (AFM) layer 14, a conventional pinned layer 16, a conventional tunneling barrier layer 18, a conventional free layer 20, and a conventional capping layer 22. Also shown is top contact 24.

Conventional contacts 11 and 24 are used in driving the current in a current-perpendicular-to-plane (CPP) direction, or along the z-axis as shown in FIG. 1. The conventional seed layer(s) 12 are typically utilized to aid in the growth of subsequent layers, such as the AFM layer 14, having a desired crystal structure. The conventional tunneling barrier layer 18 is nonmagnetic and is, for example, a thin insulator such as MgO.

The conventional pinned layer 16 and the conventional free layer 20 are magnetic. The magnetization 17 of the conventional pinned layer 16 is fixed, or pinned, in a particular direction, typically by an exchange-bias interaction with the AFM layer 14. Although depicted as a simple (single) layer, the conventional pinned layer 16 may include multiple layers. For example, the conventional pinned layer 16 may be a synthetic antiferromagnetic (SAF) layer including magnetic layers antiferromagnetically coupled through thin conductive layers, such as Ru. In such a SAF, multiple magnetic layers interleaved with a thin layer of Ru may be used. In another embodiment, the coupling across the Ru layers can be ferromagnetic. Further, other versions of the conventional MTJ 10 might include an additional pinned layer (not shown) separated from the free layer 20 by an additional nonmagnetic barrier or conductive layer (not shown).

The conventional free layer 20 has a changeable magnetization 21. Although depicted as a simple layer, the conventional free layer 20 may also include multiple layers. For example, the conventional free layer 20 may be a synthetic layer including magnetic layers antiferromagnetically or ferromagnetically coupled through thin conductive layers, such as Ru. Although shown as in-plane, the magnetization 21 of the conventional free layer 20 may have a perpendicular anisotropy. Thus, the pinned layer 16 and free layer 20 may have their magnetizations 17 and 21, respectively oriented perpendicular to the plane of the layers.

To switch the magnetization 21 of the conventional free layer 20, a current is driven perpendicular to plane (in the z-direction). When a sufficient current is driven from the top contact 24 to the bottom contact 11, the magnetization 21 of the conventional free layer 20 may switch to be parallel to the magnetization 17 of the conventional pinned layer 16. When a sufficient current is driven from the bottom contact 11 to the top contact 24, the magnetization 21 of the free layer may switch to be antiparallel to that of the pinned layer 16. The differences in magnetic configurations correspond to different magnetoresistances and thus different logical states (e.g. a logical "0" and a logical "1") of the conventional MTJ 10.

When used in STT-MRAM applications, the free layer 20 of the conventional MTJ 10 is desired to be switched at a relatively low current. The critical switching current ($I_{c0}$) is the lowest current at which the infinitesimal precession of free layer magnetization 21 around the equilibrium orientation becomes unstable. For example, $I_{c0}$ may be desired to be on the order of a few mA or less. In addition, a short current pulse is desired to be used in programming the conventional magnetic element 10 at higher data rates. For example, current pulses on the order of 20-30 ns or less are desired.

Although the conventional MTJ 10 may be written using spin transfer and used in an STT-MRAM, there are drawbacks. For example, the write error rates may be higher than desired for memories having an acceptable $I_{c0}$ and pulse width. The write error rate (WER) is the probability that a cell (i.e. the magnetization 21 of free layer 20 of the conventional magnetic junction) is not switched when subjected to a current that is at least equal to the typical switching current. The WER is desired to be $10^{-9}$ or less. However, the conventional free layer 20 typically has a WER greatly in excess of this value. In addition, it has been determined that the WER may be challenging to improve for shorter write current pulses. For example, FIG. 2 is a graph 50 depicts trends in WERs for pulses of different widths. Note that actual data are not plotted in the graph 50. Instead, the graph 50 is meant to indicate trends. The pulse width, from longest to shortest, is for curves 52, 54, 56, and 58. As can be seen in the graph 50, for higher pulse widths, the WER versus write current has a higher slope. Thus, application of a higher write current for the same pulse width may bring about a significant reduction in the WER. However, as the pulse widths shorten in curves 54, 56, and 58, the slope of the curves 54, 56, and 58 decreases. For a decreasing pulse width, an increase in current is less likely to bring about a reduction in the WER. Consequently, memories employing the conventional MTJ 10 may have unacceptably high WER that may not be cured by an increase in write current.

Various conventional solutions have been proposed to improve characteristics such as the WER. For example, magnetic field assisted switching and/or a magnetic junction having a complex structure may be used. However, the ability of such conventional schemes to reduce the WER while preserving other characteristics is limited. For example, scalability, energy consumption, and/or thermal stability may be adversely affected by such conventional methods.

In addition to the WER, other issues may exist for the conventional MTJ 10. For conventional MTJs 10 having the magnetizations 17 and 21 oriented perpendicular, the magnetoresistance may be lower than a conventional MTJ 10 having its magnetization in-plane. As a result, the signal from the conventional MTJ 10 may be lower than desired. Such perpendicular conventional MTJs 10 also exhibit high damping. As such, switching performance is adversely affected. Thus, performance of a memory using the conventional MTJ 10 is still desired to be improved.

Accordingly, what is needed is a method and system that may improve the performance of the spin transfer torque based memories. The method and system described herein address such a need.

BRIEF SUMMARY OF THE INVENTION

A method and system for providing a magnetic junction usable in a magnetic device are described. The magnetic junction includes a pinned layer, a nonmagnetic spacer layer, and a free layer. The nonmagnetic spacer layer is between the pinned layer and the free layer. The magnetic junction is configured such that the free layer is switchable between a plurality of stable magnetic states when a write current is passed through the magnetic junction. At least one of the pinned layer and the free layer includes a magnetic substructure. The magnetic substructure at least two magnetic layers interleaved with at least one insertion layer. Each of the at least one insertion layer includes at least one of Bi, W, I, Zn, Nb, Ag, Cd, Hf, Os, Mo, Ca, Hg, Sc, Y, Sr, Mg, Ti, Ba, K, Na, Rb, Pb, and Zr. The at least two magnetic layers are ferromagnetically coupled.

DETAILED DESCRIPTION OF THE INVENTION

Figure 1:
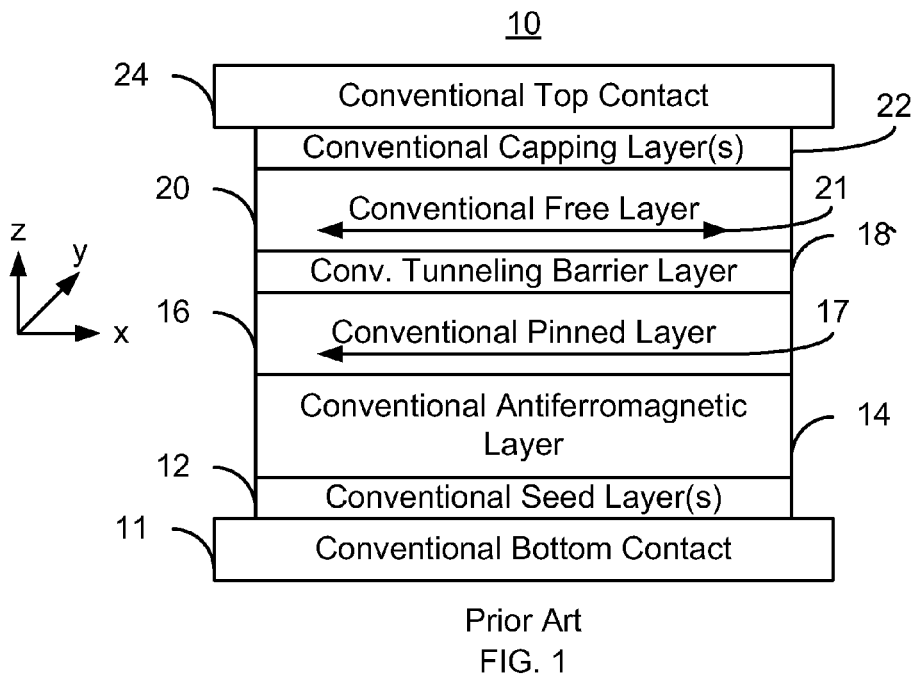
FIG. 1 depicts a conventional magnetic junction.
Figure 2:
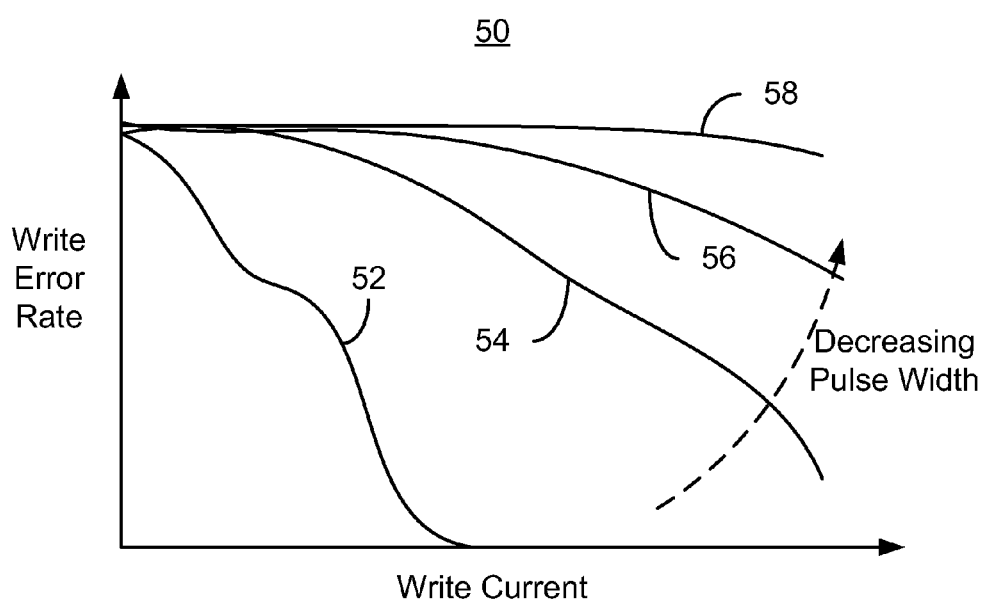
FIG. 2 is a graph depicting trends in write current versus write error rate.

The exemplary embodiments relate to magnetic junctions usable in magnetic devices, such as magnetic memories, and the devices using such magnetic junctions. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

Methods and systems for providing a magnetic junction as well as a magnetic memory utilizing the magnetic junction are described. The exemplary embodiments provide methods and systems for providing a magnetic junction usable in a magnetic device. The magnetic junction includes a pinned layer, a nonmagnetic spacer layer, and a free layer. The nonmagnetic spacer layer is between the pinned layer and the free layer. The magnetic junction is configured such that the free layer is switchable between a plurality of stable magnetic states when a write current is passed through the magnetic junction. At least one of the pinned layer and the free layer includes a magnetic substructure. The magnetic substructure includes at least two magnetic layers interleaved with at least one insertion layer. Each insertion layer includes at least one of Bi, W, I, Zn, Nb, Ag, Cd, Hf, Os, Mo, Ca, Hg, Sc, Y, Sr, Mg, Ti, Ba, K, Na, Rb, Pb, and Zr. The magnetic layers are exchange coupled.

The exemplary embodiments are described in the context of particular magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions and substructures. However, one of ordinary skill in the art will readily recognize that the method and system are consistent with the use of magnetic memories having multiple magnetic junctions and using multiple substructures. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

Figure 3A:
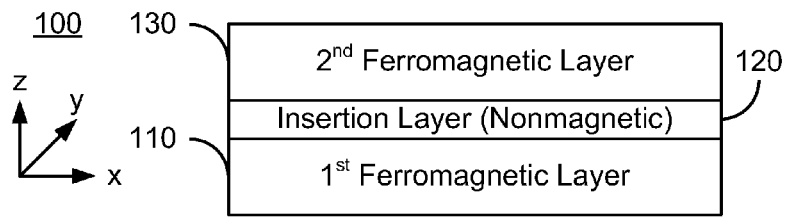
FIG. 3A depicts an exemplary embodiment of a magnetic substructure.

FIG. 3A depicts an exemplary embodiment of a magnetic substructure 100 usable in a magnetic device, for example a magnetic tunneling junction (MTJ), spin valve, or ballistic magnetoresistance structure, or some combination thereof. The magnetic device in which the magnetic substructure 100 is used may be used in a variety of applications. For example, the magnetic device, and thus the magnetic substructure, may be used in a magnetic memory such as an STT-MRAM. For clarity, FIG. 3 is not to scale. The magnetic substructure 100 includes a first ferromagnetic layer 110, an insertion layer 120, and a second ferromagnetic layer 130. Although layers 110, 120, and 130 are shown with a particular orientation, this orientation may vary in other embodiments. For example, the ferromagnetic layer 110 may be at the top (furthest from a substrate that is not shown) of the magnetic substructure 100.

The ferromagnetic layers 110 and 130 may include one or more of Ni, Fe, and Co, particularly in an alloy form. In some embodiments, the ferromagnetic layers 110 and 130 include CoFe. In some such embodiments, the ferromagnetic layers 110 and 130 consist of CoFeB. One or both of the ferromagnetic layers 110 and 130 are configured to be stable at room temperature. For example, the magnetic anisotropy energy for the ferromagnetic layers 110 and/or 130 may be at least sixty times $k_bT$. In some embodiments, the magnetic anisotropy energies for the ferromagnetic layers 110 and/or 130 are at least eighty times $k_bT$ at room temperature (approximately thirty degrees centigrade). In addition, the layers 110 and 130 are magnetically coupled. In some such embodiments, the layers 110 and 130 are exchange coupled. In some embodiments, this exchange coupling promotes substantially parallel orientations of the magnetizations (not shown in FIG. 3) of the ferromagnetic layers 110 and 130. In other embodiments, the exchange coupling may promote substantially antiparallel or other relative orientation of the magnetizations of the layers 110 and 130. In some of these embodiments, the layer 110 and/or 130 may have a high perpendicular anisotropy. Stated differently, the layer 110 and/or 130 may be weakly in-plane. For example, in some such embodiments, the perpendicular anisotropy energy of the layer 110 and/or 130 may be close to, but less than, the out-of-plane demagnetization energy (approaching $2\pi M_s^2$ for large cells and less than $2\pi M_s^2$ for smaller cells due to decreased demagnetization field at the edges). For example, the perpendicular anisotropy energy may be at least forty percent of the out-of-plane demagnetization energy. In some such embodiments, the perpendicular anisotropy energy may be not more than ninety percent of the demagnetization energy. In other embodiments, the magnetizations of the layers 110 and 130 are both perpendicular. In still other embodiments, one or both of the magnetizations of the layers 110 and 130 have components in plane and perpendicular to plane.

The insertion layer 120 is a nonmagnetic layer residing between the ferromagnetic layers 110 and 130. Even though this layer would be nonmagnetic by itself, it may have a small magnetic moment induced by adjacent magnetic materials. As used herein, the term "nonmagnetic" includes the possibility of an induced magnetic moment. The insertion layer 120 may be conductive. For example, the insertion layer 120 may include materials such as at least one of Bi, W, I, Zn, Nb, Ag, Cd, Hf, Os, Mo, Ca, Hg, Sc, Y, Sr, Mg, Ti, Ba, K, Na, Rb, Pb, and Zr. In some such embodiments, the insertion layer 120 consists of one of Bi, W, I, Zn, Nb, Ag, Cd, Hf, Os, Mo, Ca, Hg, Sc, Y, Sr, Mg, Ti, Ba, K, Na, Rb, Pb, and Zr. In other embodiments, the insertion layer 120 may be an insulator such as aluminum oxide and/or MgO. The insertion layer 120 may be used to tailor the magnetic coupling between the layers 110 and 130. The insertion layer 120 may also be used to improve the tunneling magnetoresistance (TMR) of a magnetic tunneling junction, employing the magnetic substructure 100. The coupling between the ferromagnetic layers of the magnetic substructure 100 and the TMR of the magnetic tunneling junction employing the magnetic substructure 100 may be tailored by changing the composition and thickness of the insertion layer 120 as well as the thicknesses and compositions of the ferromagnetic layers 110 and 130.

The properties of the magnetic substructure 100 may be tailored using a combination of the insertion layer 120 and the ferromagnetic layers 110 and 130. As a result, the properties of a magnetic device in which the magnetic substructure 100 is used may also be configured as desired. For example, the TMR of the magnetic device in which the magnetic substructure 100 is used may be enhanced due to improved crystallization of the free layer and lattice match with the tunneling junction, especially for a tunneling junction with two barriers. The switching characteristics, such as the WER and data rate, may be enhanced in a magnetic device in which the magnetic substructure 100 is used.

In some embodiments, the magnetic substructure 100 may also be configured to improve the perpendicular magnetic anisotropy and/or other characteristics of the magnetic device in which the magnetic substructure 100 is used. For example, the nonmagnetic insertion layer 120 may be configured to attract specific nonmagnetic materials, or dopants, used in the magnetic layer(s) 110 and/or 130. In some such embodiments, the nonmagnetic insertion layer 120 of the magnetic substructure 100 may include at least one of Bi, W, I, Zn, Nb, Ag, Cd, Hf, Os, Mo, Ca, Hg, Sc, Y, Sr, Mg, Ti, Ba, K, Na, Rb, Pb, and Zr. In some such embodiments, the nonmagnetic insertion layer 120 consists of one of Bi, W, I, Zn, Nb, Ag, Cd, Hf, Os, Mo, Ca, Hg, Sc, Y, Sr, Mg, Ti, Ba, K, Na, Rb, Pb, and Zr. Use of such a nonmagnetic insertion layer 120 may be particularly efficacious if one or more of the magnetic layers 110 and 130 includes B. For example, the magnetic layers 110 and/or 130 may include CoFeB, CoFeBTa and/or FeB. In such embodiments, the B and/or Ta concentration may be not more than thirty atomic percent. In other embodiments, the magnetic layer 110 and/or 130 includes Co, Fe and Ni and at least one of Ta, B, Zr, Cr, V, Al, Be, Ti, Zn, Hf, Pd, Pt, Bi and Ga. For example, the magnetic layer 110 and/or 130 may take the form $Co_{x1}Fe_{x2}Ni_{x3}Mn_{x4}M1_{y1}M2_{y2}$, where x1, x2, x3, y1, y2 and y3 are each at least zero and not more than one, wherein x1+x2+x3+x4+y1+y2=1 and M1 and M2 are selected from Ta, B, Zr, Cr, V, Al, Be, Ti, Au, Hf, Pd, Pt, Bi and Ga. In such embodiments, the nonmagnetic insertion layer 120 is still desired to allow the magnetic layers 110 and 130 to be magnetically coupled. As used herein "magnetic" coupling may include ferromagnetic, antiferromagnetic and/or other types of magnetic coupling. In some such embodiments, the magnetic layers 110 and 130 are exchange coupled. In such embodiments, the nonmagnetic insertion layer 120 may be not more than five Angstroms thick. However, in other embodiments, other thicknesses may be used. Further, for lower thicknesses, the insertion layer 120, as well as other insertion layers described herein, may be discontinuous.

In such a magnetic substructure 100, the magnetic layers 110 and/or 130 may be selected to improve the perpendicular magnetic anisotropy and/or tunneling magnetoresistance of a magnetic junction in which the magnetic substructure 100 is used. For example, if such a magnetic substructure 100 is used in a free layer or pinned layer of a tunneling magnetoresistance junction, the tunneling magnetoresistance junction may also include layers of crystalline MgO that sandwich the magnetic substructure 100. The crystalline MgO may be part of a tunneling barrier layer and/or may be seed and/or capping layers used to enhance the perpendicular magnetic anisotropy of ferromagnetic layers 110 and/or 130 of the magnetic substructure 100. Materials such as CoFeB in the ferromagnetic layers 110 and/or 130 may be polarization enhancement layers that are used to optimize performance of the magnetic junction. However, the B or like materials in the ferromagnetic layers 110 and/or 130 may be likely to diffuse toward the MgO. Diffusion of such materials adversely affects the perpendicular magnetic anisotropy induced in the ferromagnetic layers 110 and/or 130. To combat this effect, the nonmagnetic insertion layer 120 may be configured to attract B and/or like materials. In another embodiment, the insertion layer can provide additional anisotropy in addition to B attraction. Thus, the nonmagnetic insertion layer 120 may include Bi, W, I, Zn, Nb, Ag, Cd, Hf, Os, Mo, Ca, Hg, Sc, Y, Sr, Mg, Ti, Ba, K, Na, Rb, Pb, and Zr. In such an embodiment, the nonmagnetic insertion layer 120 tends to attract B and like materials. Thus, B and the like are less likely to diffuse toward the MgO-magnetic layer 110/130 interface. Instead, the B and like materials may tend to diffuse toward the center of the magnetic substructure. As such, the perpendicular magnetic anisotropy of the magnetic substructure 100 may be preserved. The perpendicular magnetic anisotropy of the free layer, reference layer, or other desired layer of the magnetic junction in which the magnetic substructure 100 is used may also be enhanced. Thus, performance of the magnetic junction in which the magnetic substructure 100 is used may be improved.

Figure 3B:
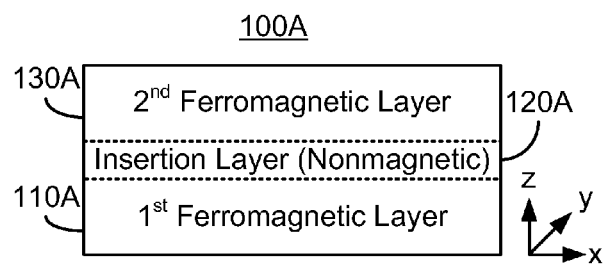
FIG. 3B depicts another exemplary embodiment of a magnetic substructure.

FIG. 3B depicts another embodiment of the magnetic substructure 100A. The magnetic substructure 100A may be used in any or all of the magnetic substructures described herein even if not specifically described as such. The magnetic substructure 100 and remaining magnetic substructures are described herein as including ferromagnetic layers and nonmagnetic insertion layers. However, such layers need not be separate layers. Instead, as depicted in FIG. 3B, the "layers" may correspond to variations in the concentration of the ferromagnetic materials used in the "layers" 110A/130A and nonmagnetic materials used in the layer 120A. This is depicted in FIG. 3B by the dashed line at the "interfaces" between the layers 110A and 120A and between the layers 120A and 130A.

Figure 3C:
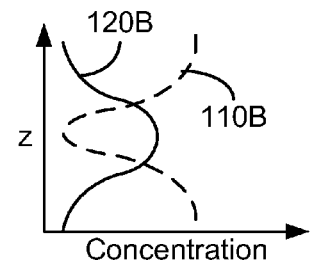
FIG. 3C depicts an exemplary embodiment of material concentrations in the magnetic substructure depicted in FIG. 3B.

For example, FIG. 3C is a graph depicting the variation in concentration of the ferromagnetic and nonmagnetic materials used in the magnetic junction 100A. Referring to FIGS. 3B-3C, the curve 120B indicates the variation of the concentration of the nonmagnetic material(s) used in the nonmagnetic insertion layer 120A with distance along the z axis. Similarly, the curve 110B indicates the variation in concentration of the magnetic material(s) used for the ferromagnetic layers 110A and 130A. Note that the curves 110B and 120B are for explanatory purposes only and not intended to depict data or simulation results for a particular embodiment. The curve 120B has a global peak in concentration in the nonmagnetic insertion layer 120A. The curve 110B has peaks in the concentration within the layers 110A and 130A. In the embodiment shown, the curves 110B and 120B cross near the interfaces of the layers 110A and 120A and 120A and 130A. However, the transition need not be located at this position. In some embodiments, the peak in concentration of the curve 120B is at least 50% of the concentration within the layer 120A. In some such embodiments, the peak in concentration of the curve 120B may be at or near 100% of the concentration of the magnetic substructure 100. In other words, the magnetic substructure 100 may consist only of the nonmagnetic material(s) for some locations within the nonmagnetic insertion layer 120A. Similarly, in some embodiments, the minima in concentration of the curve 120B may be at or near 0% in the ferromagnetic layer(s) 110A and/or 130A. Thus, the magnetic substructure 100 may consist only of the magnetic material(s) for some locations within the ferromagnetic layers 110A and/or 130A. However, in other embodiments, the variation in concentration of the nonmagnetic insertion layer may be smaller.

For such embodiments of the magnetic substructure 100A, the magnetic layers 110A and 130A may still be magnetically coupled through the nonmagnetic insertion layer 120A. Further, because the layers 110A, 120A and 130A are formed through variations in concentration, the ferromagnetic coupling may be enhanced. The materials used in the layers 120A, such as Bi, W, I, Zn, Nb, Ag, Cd, Hf, Os, Mo, Ca, Hg, Sc, Y, Sr, Mg, Ti, Ba, K, Na, Rb, Pb, and Zr, may still attract materials within the layers 110A and 130A that are likely to diffuse. For example, the insertion layer 120A may still attract B from upper and lower interfaces of the magnetic substructure 100A. Thus, performance of a magnetic junction using the magnetic substructure 100A may still be enhanced.

Figure 4:
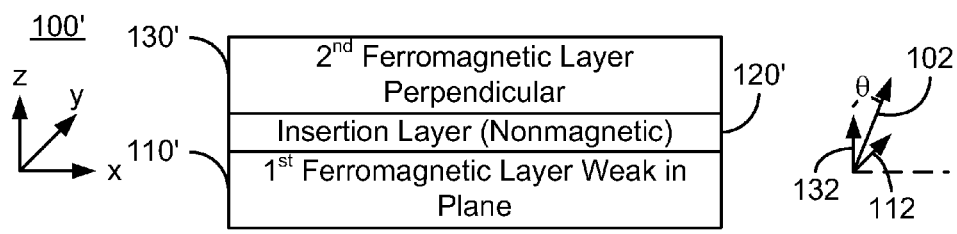
FIG. 4 depicts another exemplary embodiment of a magnetic substructure.

FIG. 4 depicts an exemplary embodiment of a magnetic substructure 100' usable in a magnetic device, for example a MTJ, spin valve, or ballistic magnetoresistance structure, or some combination thereof. The magnetic device in which the magnetic substructure 100' is used may be used in a variety of applications. For example, the magnetic device, and thus the magnetic substructure, may be used in a magnetic memory such as an STT-MRAM. For clarity, FIG. 4 is not to scale. The magnetic substructure 100' is analogous to the magnetic substructure 100. Consequently, analogous components are labeled similarly. The magnetic substructure 100' thus includes a first ferromagnetic layer 110', an insertion layer 120', and a second ferromagnetic layer 130' that are analogous to the first ferromagnetic layer 110, the insertion layer 120, and the second ferromagnetic layer 130. Although layers 110', 120', and 130' are shown with a particular orientation, this orientation may vary in other embodiments. For example, the ferromagnetic layer 110' may be at the top (furthest from a substrate that is not shown) of the magnetic substructure 100'.

The magnetic substructure 100' is configured such that the ferromagnetic layer 110' has a weak in-plane anisotropy. Thus, the perpendicular anisotropy energy of the layer 110' may be close to, but less than, the out-of-plane demagnetization energy. For example, the perpendicular anisotropy energy may be at least forty percent of the out-of-plane demagnetization energy for the layer 110'. In some such embodiments, the perpendicular anisotropy energy may be not more than ninety percent of the demagnetization energy. Thus, without the interaction with the layer 130', the magnetization of the ferromagnetic layer 110 is in plane. In contrast, the layer 130' has a high perpendicular anisotropy. Thus, the perpendicular anisotropy energy is greater than the out-of-plane demagnetization energy. In some embodiments, the perpendicular anisotropy energy is significantly greater than the out-of-plane demagnetization energy. For example, in some embodiments, the perpendicular anisotropy energy may be two through four kilooersted (or more) greater than the out-of-plane demagnetization energy.

The ferromagnetic layers 110' and 130' may include one or more of Ni, Fe, and Co, particularly in an alloy form. In some embodiments, the ferromagnetic layers 110' and 130' include CoFe in some form, such as CoFeB. For example, in some embodiments, the ferromagnetic layers 110' and/or 130' could include alloys such CoFeB, CoPd, CoPt, FePt, as simple layers and/or multilayers such as Co/Pd, Co/Pt, Fe/Pt, Co/Ru. At least one of the ferromagnetic layers 110' and 130' is configured to be stable at room temperature. Other materials described above may be used for the layers 110', 120' and/or 130'. For example, the magnetic anisotropy energy for one or both of the ferromagnetic layers 110' and/or 130' may be at least sixty times $k_bT$. In some embodiments, the magnetic anisotropy energies for one or both of the ferromagnetic layers 110' and/or 130' are at least eighty times $k_bT$ at room temperature (approximately thirty degrees centigrade).

The ferromagnetic layers 110' and 130' are magnetically coupled. In some such embodiments, the layers 110' and 130' are exchange coupled. The net result of the magnetizations are also shown in FIG. 4. The magnetization 112 of the ferromagnetic layer 110', the magnetization 132 of the ferromagnetic layer 130' and the net magnetization 102 of the structure 100' are shown. As can be seen in FIG. 4, the magnetization 112 is not in-plane. This is because of the magnetic coupling between the layers 110' and 130'. The high perpendicular anisotropy energy layer 130' is magnetically coupled with the weakly in-plane layer 110', causing the magnetization 112 of the layer 110' to be out-of-plane. Thus, the magnetization 112 has components in-plane and perpendicular-to-plane. As a result, the net moment of the magnetic structure 100' has components in plane and perpendicular-to-plane. Because of the exchange interaction between the layers 110' and 130', the magnetization 102 of the magnetic substructure 100' is at an angle θ from the z-axis (normal to the plane of the magnetic substructure 100'). The net result is that the magnetization 102 of the magnetic substructure 100' is stable in an angle from the z-axis. Consequently, improved switching characteristics, thermal stability, and scalability may be achieved.

This initial nonzero angle allows the magnetization of the magnetic substructure 100' to be more easily switched by a spin transfer torque. For example, the magnetic substructure 100' may be used in an MTJ. This characteristic corresponds to a lower write error rate for such a magnetic element. The lower WER may be achieved even at low pulse widths (high data rates). In particular, the slope of the write error rate versus write current may remain sufficiently large even for pulse widths of less than ten ns. In some embodiments, an acceptable write error rate of $10^{-9}$ or less may be achieved for pulse widths of 10-30 ns or less. Thus, instead of assisting switching using a mechanism such as an external field, the physical cause of the high error rates is addressed. Consequently, when used in a magnetic element, such as an MTJ, the magnetic substructure 100' may have an improved write error rate even for lower pulse widths.

Figure 5:
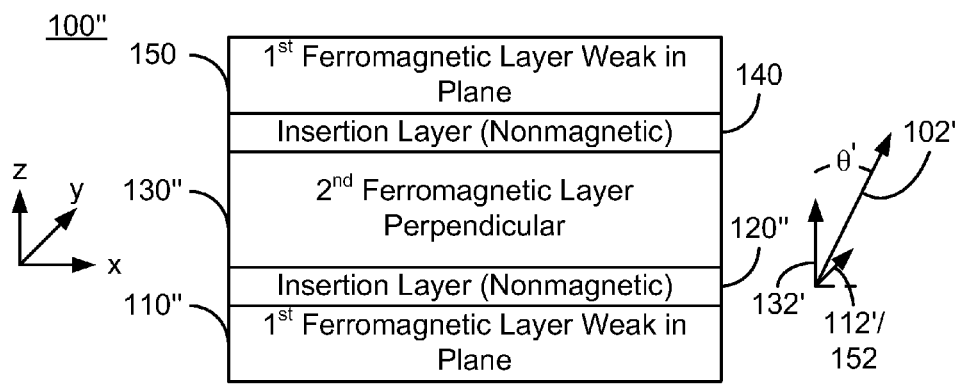
FIG. 5 depicts another exemplary embodiment of a magnetic substructure.

FIG. 5 depicts an exemplary embodiment of a magnetic substructure 100" usable in a magnetic device, for example a MTJ, spin valve, or ballistic magnetoresistance structure, or some combination thereof. The magnetic device in which the magnetic substructure 100" is used may be used in a variety of applications. For example, the magnetic device, and thus the magnetic substructure, may be used in a magnetic memory such as an STT-MRAM. For clarity, FIG. 5 is not to scale. The magnetic substructure 100" is analogous to the magnetic substructures 100 and 100'. Consequently, analogous components are labeled similarly. The magnetic substructure 100" thus includes a first ferromagnetic layer 110", an insertion layer 120", and a second ferromagnetic layer 130" that are analogous to the first ferromagnetic layer 110/110', the insertion layer 120/120', and the second ferromagnetic layer 130/130'. Although layers 110", 120", and 130" are shown with a particular orientation, this orientation may vary in other embodiments. For example, the ferromagnetic layer 110" may be at the top (furthest from a substrate that is not shown) of the magnetic substructure 100".

The magnetic substructure 100" also includes an additional insertion layer 140 and another ferromagnetic layer 150. In the embodiment shown, the layers 110" and 150 have a weak in-plane anisotropy. Thus, without more, the magnetizations of the ferromagnetic layers 110" and 150 are in plane. The layer 130" is strongly perpendicular. In some embodiments, the layer 130" is thicker than the layers 110" and 150. For example, the layer 130" may have a thickness equal to the sum of the thicknesses of the layers 110" and 150. The layers 110", 130" and 150 are magnetically coupled. In some embodiments, the layers 110", 130", and 150 are exchange coupled. Further, the layer 130" is magnetically stable at room temperature. In some embodiments, the magnetic anisotropy energy for the ferromagnetic layer 130" are at least sixty times $k_bT$ at room temperature. In some such embodiments, the magnetic anisotropy energies for the ferromagnetic layer 130" is at least eighty times $k_bT$ at room temperature.

FIG. 5 also depicts the magnetizations 112', 132' and 152 of the layers 110", 130", and 150, respectively. Further, the net magnetization 102' of the magnetic substructure 100" is shown. The magnetizations 112' and 152 are shown as being the same. However, in other embodiments, the magnetizations 112' and 152 may differ. As can be seen in FIG. 5, the magnetizations 112' and 152 are not in-plane. This is because of the magnetic coupling between the layers 110"/150 and 130". As a result, the net moment 102' of the magnetic structure 100" has components in plane and perpendicular-to-plane. Because of the exchange interaction between the layers 110"/150 and 130", the magnetization 102' of the magnetic substructure 100' is at an angle θ' from the z-axis (normal to the plane of the magnetic substructure 100"). The net result is that the magnetization 102 of the magnetic substructure 100" is stable at an angle from the z-axis. Consequently, improved switching characteristics, thermal stability, and scalability may be achieved.

The magnetic substructure 100" shares the benefits of the magnetic substructure 100'. In particular, when used in a magnetic element, such as an MTJ, the MTJ may have a lower WER. Consequently, when used in a magnetic element, such as an MTJ, the magnetic substructure 100" may have an improved write error rate even for lower pulse widths. At the same time, the magnetic substructure 100" may be magnetically stable.

Figure 6:
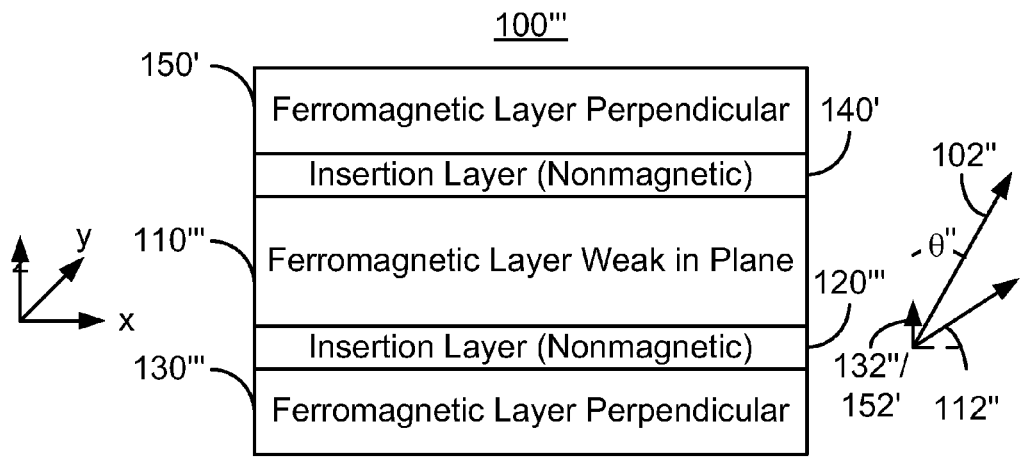
FIG. 6 depicts another exemplary embodiment of a magnetic substructure.

FIG. 6 depicts an exemplary embodiment of a magnetic substructure 100''' usable in a magnetic device, for example a MTJ, spin valve, or ballistic magnetoresistance structure, or some combination thereof. The magnetic device in which the magnetic substructure 100''' is used may be used in a variety of applications. For example, the magnetic device, and thus the magnetic substructure, may be used in a magnetic memory such as an STT-MRAM. For clarity, FIG. 6 is not to scale. The magnetic substructure 100''' is analogous to the magnetic substructures 100, 100', and 100". Consequently, analogous components are labeled similarly. The magnetic substructure 100''' thus includes a first ferromagnetic layer 110''', an insertion layer 120''', a second ferromagnetic layer 130''', an additional insertion layer 140' and an additional ferromagnetic layer 150' that are analogous to the first ferromagnetic layer 110/110'/110", the insertion layer 120/120'/120", the second ferromagnetic layer 130/130'/130", the additional insertion layer 140, and the additional ferromagnetic layer 150. Although layers 110''', 120''', 130''', 140', and 150' are shown with a particular orientation, this orientation may vary in other embodiments. For example, the ferromagnetic layer 130''' may be at the top (furthest from a substrate that is not shown) of the magnetic substructure 100'''.

In the magnetic substructure 100''', the weakly in-plane layer 110''' is between the perpendicular layers 130''' and 150'. Without more, the magnetization of the ferromagnetic layer 110''' is in plane. In some embodiments, the layer 110''' is thicker than the layers 130''' and 150'. For example, the layer 110''' may have a thickness equal to the sum of the thicknesses of the layers 130''' and 150'. The layers 110''', 130''' and 150' are magnetically coupled. In some embodiments, the layers 110''', 130''', and 150' are exchange coupled. Further, the layers 130''' and 150' are magnetically stable at room temperature. In some embodiments, the magnetic anisotropy energies for the ferromagnetic layers 130''', and/or 150' are at least sixty times $k_bT$ at room temperature. In other embodiments, the magnetic anisotropy energies for the ferromagnetic layers 110''', 130''', and/or 150' are at least eighty times $k_bT$ at room temperature.

FIG. 6 also depicts the magnetizations 112", 132" and 152' of the layers 110''', 130''', and 150', respectively. Further, the net magnetization 102" of the magnetic substructure 100''' is shown. The magnetizations 132" and 152' are shown as being the same. However, in other embodiments, the magnetizations 132" and 152' may differ. As can be seen in FIG. 6, the magnetization 112" is not in-plane. This is because of the magnetic coupling between the layers 110''' and 130'''/150'. As a result, the net moment 102" of the magnetic structure 100''' has components in plane and perpendicular-to-plane. Because of the exchange interaction between the layers 110''' and 130'''/150', the magnetization 102" of the magnetic substructure 100" is at an angle θ" from the z-axis (normal to the plane of the magnetic substructure 100'''). The net result is that the magnetization 102" of the magnetic substructure 100''' is stable at an angle from the z-axis. Consequently, improved switching characteristics, thermal stability, and scalability may be achieved.

The magnetic substructure 100''' shares the benefits of the magnetic substructure 100'. In particular, when used in a magnetic element, such as an MTJ, the MTJ may have a lower WER. Consequently, when used in a magnetic element, such as an MTJ, the magnetic substructure 100''' may have an improved write error rate even for lower pulse widths. At the same time, the magnetic substructure 100''' may be magnetically stable.

Figure 7:
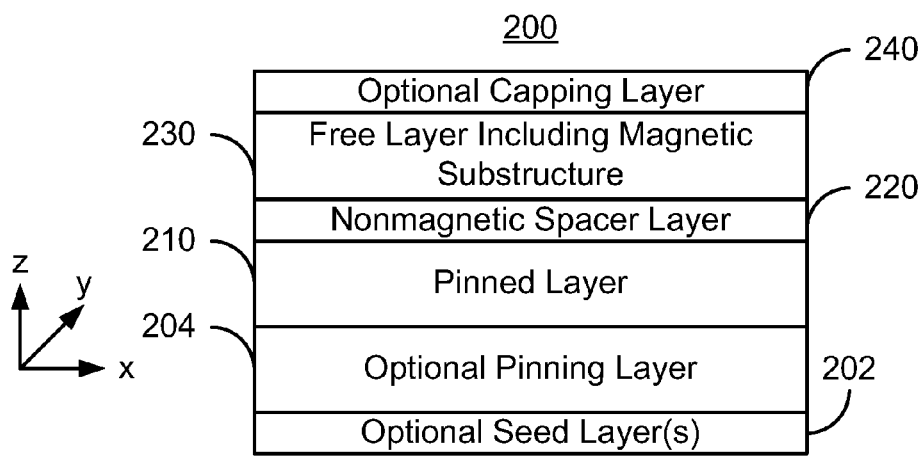
FIG. 7 depicts an exemplary embodiment of a magnetic junction including magnetic substructure.

FIG. 7 depicts an exemplary embodiment of a magnetic junction 200 including magnetic substructure. For clarity, FIG. 7 is not to scale. The magnetic junction 200 includes a pinned layer 210, a nonmagnetic spacer layer 220, and a free layer 230. Although layers 210, 220, and 230 are shown with a particular orientation, this orientation may vary in other embodiments. For example, the pinned layer 210 may be closer to the top (furthest from a substrate that is not shown) of the magnetic junction 200. Also shown are optional seed layer 202, optional pinning layer 204, and optional capping layer 240. The optional pinning layer 204 may be used to fix the magnetization (not shown) of the pinned layer 210. In some embodiments, the optional pinning layer 204 may be an AFM layer or multilayer that pins the magnetization (not shown) of the pinned layer 210 by an exchange-bias interaction. However, in other embodiments, the optional pinning layer 204 may be omitted or another structure may be used. The magnetic junction 200 is also configured to allow the free layer 230 to be switched between stable magnetic states when a write current is passed through the magnetic junction 200. Thus, the free layer 230 is switchable utilizing spin transfer torque.

Although depicted as a simple layer, the pinned layer 210 may include multiple layers. For example, the pinned layer 210 may be a SAF including magnetic layers antiferromagnetically or ferromagnetically coupled through thin layers, such as Ru. In such a SAF, multiple magnetic layers interleaved with thin layer(s) of Ru or other material may be used. The pinned layer 210 may also be another multilayer. Although a magnetization is not depicted in FIG. 7, the pinned layer 210 may have a perpendicular anisotropy energy that exceeds the out-of-plane demagnetization energy. Thus, the pinned layer 210 may have its magnetic moment oriented perpendicular to plane. In other embodiments, the magnetic moment of the pinned layer 210 is in-plane. Other orientations of the magnetization of the pinned layer 210 are possible.

The spacer layer 220 is nonmagnetic. In some embodiments, the spacer layer 220 is an insulator, for example a tunneling barrier. In such embodiments, the spacer layer 220 may include crystalline MgO, which may enhance the TMR of the magnetic junction. In other embodiments, the spacer layer may be a conductor, such as Cu. In alternate embodiments, the spacer layer 220 might have another structure, for example a granular layer including conductive channels in an insulating matrix.

The free layer 230 includes the magnetic substructure 100, 100', 100", and/or 100'''. In some embodiments, the free layer 230 is composed of the magnetic substructure 100, 100', 100", and/or 100'''. The free layer 230 may also include polarization enhancement layers such as CoFeB, CoFeBTa or FeB, with not more than thirty atomic percent B and/or Ta, at the interfaces with the layer(s) 220 and/or 240.

Because the magnetic substructure 100, 100', 100", and/or 100''' is used in the free layer 230, the magnetic junction 200 may share the benefits of the magnetic substructure 100, 100', 100", and/or 100'''. In particular, the magnetic junction 200 may be thermally stable. Further, the net magnetic magnetization of the free layer 230 may be at an angle from the z axis that is less than ninety degrees, but greater than zero degrees. Stated differently, the net magnetization of the free layer 230 is canted from the z-axis. Thus, the free layer 230 may be easier to switch using spin transfer torque. Further, the WER of the magnetic junction may be reduced.

In some embodiments of the magnetic junction 200, the optional capping layer 240 and nonmagnetic spacer layer 220 may each be formed of MgO. Crystalline MgO may be used for the nonmagnetic spacer layer 220 in order to enhance the magnetoresistance of the junction 200. The optional capping layer 240 may be used to enhance the perpendicular magnetic anisotropy of the free layer 230. In such embodiments, the magnetic substructure of the free layer 230, such as the magnetic substructure 100, may be sandwiched between MgO layers. For a magnetic substructure used in the free layer 230, the nonmagnetic insertion layer 120, 120', 120", 120''', 140 and/or 140' may be configured to attract particular materials such as B. in some embodiments, the nonmagnetic insertion layer 120, 120', 120", 140 and/or 140' may be desired to include Bi, W, I, Zn, Nb, Ag, Cd, Hf, and/or Zr. This is particularly true if the magnetic layers 110/130, 110'/130', 110"/130"/150, and/or 110'''/130'''/150 include materials such as B. for example, the one or more magnetic layers of the magnetic substructure 100, 100A, 100', 100", and/or 100''' may take the form $Co_{x1}Fe_{x2}Ni_{x3}Mn_{x4}M1_{y1}M2_{y2}$, where x1, x2, x3, y1, y2 and y3 are each at least zero and not more than one, wherein x1+x2+x3+x4+y1+y2=1 and M1 and M2 are selected from Ta, B, Zr, Cr, V, Al, Be, Ti, Au, Hf, Pd, Pt, Bi and Ga.

As described above with respect to FIGS. 3A-3C, use of such materials in magnetic substructure of the free layer 230 may reduce or prevent diffusion of materials such as B to the interface between the free layer 230 and the layers 220 and/or 240. Instead, B and the like may tend to move toward the center of the free layer 230. As a result, degradation of the perpendicular magnetic anisotropy and/or magnetoresistance of the magnetic junction 200 may be diminished or prevented. Thus, performance of the magnetic junction 200 may be improved.

Figure 8:
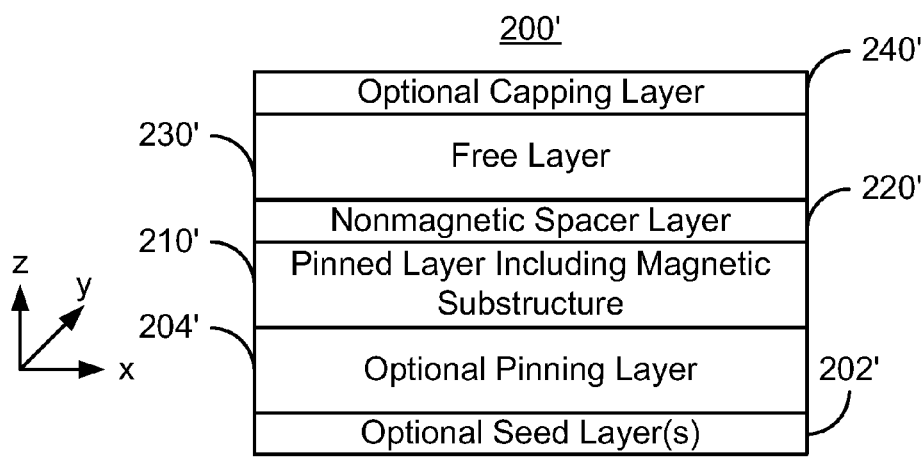
FIG. 8 depicts another exemplary embodiment of a magnetic junction including magnetic substructure.

FIG. 8 depicts an exemplary embodiment of a magnetic junction 200' including magnetic substructure. For clarity, FIG. 8 is not to scale. The magnetic junction 200' is analogous to the magnetic junction 200. Thus, analogous layers are labeled similarly. The magnetic junction 200' includes a pinned layer 210', a nonmagnetic spacer layer 220', and a free layer 230' analogous to the layers 210, 220, and 230, respectively. Although layers 210', 220', and 230' are shown with a particular orientation, this orientation may vary in other embodiments. For example, the pinned layer 210' may be closer to the top (furthest from a substrate that is not shown) of the magnetic junction 200'. Also shown are optional seed layer 202', optional pinning layer 204' and optional capping layer 240' analogous to the optional seed layer 202, optional pinning layer 204, and optional capping layer 240. The magnetic junction 200' is also configured to allow the free layer 230' to be switched between stable magnetic states when a write current is passed through the magnetic junction 200'. Thus, the free layer 230' is switchable utilizing spin transfer torque.

The spacer layer 220' is nonmagnetic. In some embodiments, the spacer layer 220' is an insulator, for example a tunneling barrier. In such embodiments, the spacer layer 220' may include crystalline MgO, which may enhance the tunneling magnetoresistance (TMR) of the magnetic junction. In other embodiments, the spacer layer may be a conductor, such as Cu. In alternate embodiments, the spacer layer 220' might have another structure, for example a granular layer including conductive channels in an insulating matrix.

The free layer 230' may be a simple layer or may include multiple layers. For example, the free layer 230' may be a SAF including magnetic layers antiferromagnetically or ferromagnetically coupled through thin layers, such as Ru. In such a SAF, multiple magnetic layers interleaved with thin layer(s) of Ru or other material may be used. The free layer 230' may also be another multilayer. Although a magnetization is not depicted in FIG. 8, the free layer may have a perpendicular anisotropy energy that exceeds the out-of-plane demagnetization energy.

The pinned layer 210' includes the magnetic substructure 100, 100', 100", and/or 100'''. In some embodiments, the pinned layer 210' is composed of the magnetic substructure 100, 100', 100", and/or 100'''. The pinned layer 210' may also include polarization enhancement layers such as CoFeB, CoFeBTa or FeB, with not more than thirty atomic percent B and/or Ta, at the interfaces with the layer(s) 220' and/or 204'.

In some embodiments of the magnetic junction 200', the optional seed layer 202' and nonmagnetic spacer layer 220' may each be formed of MgO. Crystalline MgO may be used for the nonmagnetic spacer layer 220' in order to enhance the magnetoresistance of the junction 200'. The optional seed layer 202' may be used to enhance the perpendicular magnetic anisotropy of the pinned layer 210' particularly if the optional pinning layer 204' is omitted. In such embodiments, the magnetic substructure of the pinned layer 210', such as the magnetic substructure 100, may be sandwiched between MgO layers. For a magnetic substructure used in the pinned layer 210', the nonmagnetic insertion layer 120, 120', 120", 120''', 140 and/or 140' may be configured to attract particular materials such as B. in some embodiments, the nonmagnetic insertion layer 120, 120', 120", 140 and/or 140' may be desired to include Bi, W, I, Zn, Nb, Ag, Cd, Hf, and/or Zr. This is particularly true if the magnetic layers 110/130, 110'/130', 110"/130"/150, and/or 110'''/130'''/150 include materials such as B. for example, the one or more magnetic layers of the magnetic substructure 100, 100A, 100', 100", and/or 100''' may take the form $Co_{x1}Fe_{x2}Ni_{x3}Mn_{x4}M1_{y1}M2_{y2}$, where x1, x2, x3, y1, y2 and y3 are each at least zero and not more than one, wherein x1+x2+ x3+x4+y1+y2=1 and M1 and M2 are selected from Ta, B, Zr, Cr, V, Al, Be, Ti, Au, Hf, Pd, Pt, Bi and Ga.

As described above with respect to FIGS. 3A-3C, use of such materials in magnetic substructure of the pinned layer 210' may reduce or prevent diffusion of materials such as B to the interface between the pinned layer 210' and the layers 220' and/or 204'. Instead, the B may tend to move toward the center of the pinned layer 210'. As a result, degradation of the perpendicular magnetic anisotropy and/or magnetoresistance of the magnetic junction 200' may be diminished or prevented. Thus, performance of the magnetic junction 200' may be improved.

Figure 9:
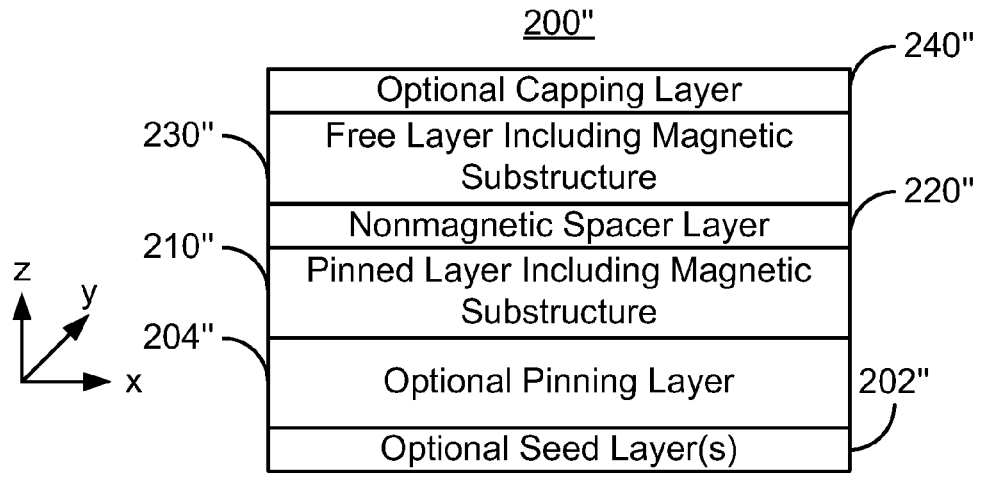
FIG. 9 depicts another exemplary embodiment of a magnetic junction including magnetic substructure.

FIG. 9 depicts an exemplary embodiment of a magnetic junction 200" including magnetic substructure. For clarity, FIG. 9 is not to scale. The magnetic junction 200" is analogous to the magnetic junctions 200 and 200'. Thus, analogous layers are labeled similarly. The magnetic junction 200" includes a pinned layer 210", a nonmagnetic spacer layer 220", and a free layer 230" analogous to the layers 210/210', 220/220', and 230/230', respectively. Although layers 210", 220", and 230" are shown with a particular orientation, this orientation may vary in other embodiments. For example, the pinned layer 210" may be closer to the top (furthest from a substrate that is not shown) of the magnetic junction 200". Also shown are optional seed layer 202", optional pinning layer 204" and optional capping layer 240" analogous to the optional seed layer 202/202', optional pinning layer 204/204', and optional capping layer 240/240'. The magnetic junction 200" is also configured to allow the free layer 230" to be switched between stable magnetic states when a write current is passed through the magnetic junction 200". Thus, the free layer 230" is switchable utilizing spin transfer torque.

The pinned layer 210" includes the magnetic substructure 100, 100', 100", and/or 100'''. In some embodiments, the pinned layer 210" is composed of the magnetic substructure 100, 100', 100", and/or 100'''. The pinned layer 210" may also include polarization enhancement layers such as CoFeB, CoFeBTa or FeB, with not more than thirty atomic percent B and/or Ta, at the interfaces with the layer(s) 220" and/or 204".

The spacer layer 220" is nonmagnetic. In some embodiments, the spacer layer 220" is an insulator, for example a tunneling barrier. In such embodiments, the spacer layer 220" may include crystalline MgO, which may enhance the TMR of the magnetic junction. In other embodiments, the spacer layer 220" may be a conductor, such as Cu. In alternate embodiments, the spacer layer 220" might have another structure, for example a granular layer including conductive channels in an insulating matrix.

The free layer 230" includes the magnetic substructure 100, 100', 100", and/or 100'''. In some embodiments, the free layer 230" is composed of the magnetic substructure 100, 100', 100", and/or 100'''. The free layer 230" may also include polarization enhancement layers such as CoFeB, CoFeBTa or FeB, with not more than thirty atomic percent B and/or Ta, at the interfaces with the layer(s) 220" and/or 240".

Because the magnetic substructure 100, 100', 100", and/or 100''' is used in the free layer 230", the magnetic junction 200" may share the benefits of the magnetic substructure 100, 100', 100", and/or 100'''. In particular, the magnetic junction 200" may be thermally stable. Further, the net magnetic magnetization of the free layer 230" may be at an angle from the z axis that is less than ninety degrees, but greater than zero degrees. Stated differently, the net magnetization of the free layer 230' is canted from the z-axis. Thus, the free layer 230' may be easier to switch using spin transfer torque. Further, the WER of the magnetic junction may be reduced.

In some embodiments of the magnetic junction 200", the optional seed layer 202", nonmagnetic spacer layer 220" and/or optional capping layer 240" may each be formed of MgO. Crystalline MgO may be used for the nonmagnetic spacer layer 220" in order to enhance the magnetoresistance of the junction 200". The optional seed layer 202" and optional capping layer 240" may be used to enhance the perpendicular magnetic anisotropy of the free layer 230" and the pinned layer 210" particularly if the optional pinning layer 204" is omitted. In such embodiments, the magnetic substructure of the free layer 230" and/or pinned layer 210", such as the magnetic substructure 100, may be sandwiched between MgO layers. For a magnetic substructure used in the pinned layer 210" and/or free layer 230", the nonmagnetic insertion layer 120, 120', 120", 120''', 140 and/or 140' may be configured to attract particular materials such as B. In some embodiments, the nonmagnetic insertion layer 120, 120', 120", 140 and/or 140' may be desired to include Bi, W, I, Zn, Nb, Ag, Cd, Hf, and/or Zr. This is particularly true if the magnetic layers 110/130, 110'/130', 110"/130"/150, and/or 110'''/130'''/150 include materials such as B. for example, the one or more magnetic layers of the magnetic substructure 100, 100A, 100', 100", and/or 100''' may take the form $Co_{x1}Fe_{x2}Ni_{x3}Mn_{x4}M1_{y1}M2_{y2}$, where x1, x2, x3, y1, y2 and y3 are each at least zero and not more than one, wherein x1+x2+x3+x4+y1+y2=1 and M1 and M2 are selected from Ta, B, Zr, Cr, V, Al, Be, Ti, Au, Hf, Pd, Pt, Bi and Ga.

As described above with respect to FIGS. 3A-3C, use of such materials in magnetic substructure of the pinned layer 210" and/or free layer 230" may reduce or prevent diffusion of materials such as B to the interfaces between the layers 204" and 210", 210" and 220", 220" and 230" and 230" and 240". Instead, the B or similar materials may tend to diffuse toward the center of the layers 210" and/or 230". As a result, degradation of the perpendicular magnetic anisotropy and/or magnetoresistance of the magnetic junction 200" may be diminished or prevented. Thus, performance of the magnetic junction 200" may be improved.

Figure 10:
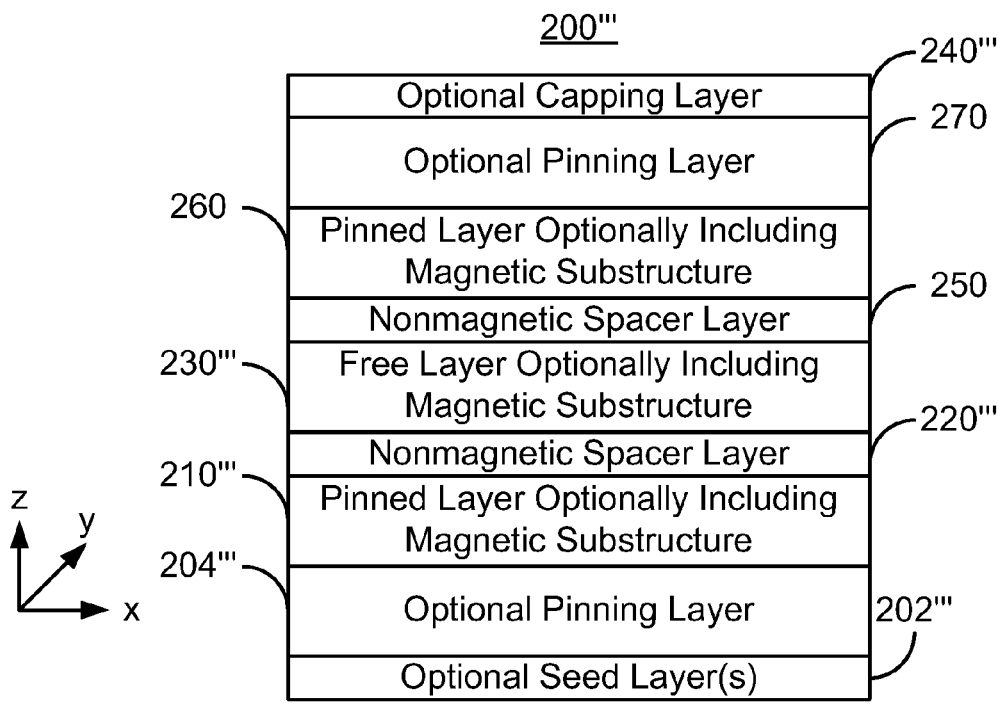
FIG. 10 depicts another exemplary embodiment of a magnetic junction including magnetic substructure.

FIG. 10 depicts an exemplary embodiment of a magnetic junction 200''' including magnetic substructure. For clarity, FIG. 10 is not to scale. The magnetic junction 200''' is analogous to the magnetic junctions 200, 200', and 200". Thus, analogous layers are labeled similarly. The magnetic junction 200''' includes a pinned layer 210''', a nonmagnetic spacer layer 220''', and a free layer 230''' analogous to the layers 210/210'/210", 220/220'/220", and 230/230'/230", respectively. The magnetic junction 200''' is also shown as including optional layers 202''', 204''', and 240''' analogous to layers 202/202'/202", 204/204'/204''', and 240''', respectively. Also shown are additional nonmagnetic spacer layer 250, additional pinned layer 260, and additional optional pinning layer 270. The layers 250, 260, and 270 are analogous to layers 220/220'/220"/220''', 210/210'/210"/210''', and 204/204'/204"/204''', respectively. Thus, the magnetic junction 200''' is a dual magnetic junction. Although layers 210''', 220''', 230''', 250, and 260 are shown with a particular orientation, this orientation may vary in other embodiments. For example, the pinned layer 210''' may be closer to the top (furthest from a substrate that is not shown) of the magnetic junction 200'''. The magnetic junction 200''' is also configured to allow the free layer 230''' to be switched between stable magnetic states when a write current is passed through the magnetic junction 200'''. Thus, the free layer 230''' is switchable utilizing spin transfer torque.

The pinned layer 210''', the free layer 230''', and/or the pinned layer 260 includes the magnetic substructure 100, 100', 100'', and/or 100'''. In some embodiments, the pinned layer 210''' the free layer 230''', and/or the pinned layer 260 is composed of the magnetic substructure 100, 100', 100'', and/or 100'''. The pinned layer 210''', free layer 230''', and/or pinned layer 260 may also include polarization enhancement layers such as CoFeB, CoFeBTa or FeB, with not more than thirty atomic percent B and/or Ta, at the interfaces with the layer(s) 204''' and 220''', 220''' and 250, and/or 250 and 270''' respectively.

Because the magnetic substructure 100, 100', 100'', and/or 100''' may be used in the free layer 230''', the magnetic junction 200''' may share the benefits of the magnetic substructure 100, 100', 100'', and/or 100'''. In particular, the magnetic junction 200''' may be thermally stable. Further, the net magnetization of the free layer 230''' may be at an angle from the z axis that is less than ninety degrees, but greater than zero degrees. Stated differently, the net magnetization of the free layer 230'' is canted from the z-axis. Thus, the free layer 230' may be easier to switch using spin transfer torque. Further, the WER of the magnetic junction may be reduced.

In some embodiments of the magnetic junction 200''', the optional seed layer 202''', nonmagnetic spacer layer 220''', nonmagnetic spacer 250 and/or optional capping layer 240''' may each be formed of MgO. Crystalline MgO may be used for the nonmagnetic spacer layers 220''' and 250 in order to enhance the magnetoresistance of the junction 200''. The optional seed layer 202''' and optional capping layer 240''' may be used to enhance the perpendicular magnetic anisotropy of the free layer 230''', the pinned layer 210''' and the pinned layer 260 particularly if the optional pinning layers 204''' and 270 are omitted. In such embodiments, the magnetic substructure of the free layer 230''', pinned layer 210'' and/or pinned layer 260, such as the magnetic substructure 100, may be sandwiched between MgO layers. For a magnetic substructure used in the pinned layer 210'' and/or free layer 230'', the nonmagnetic insertion layer 120, 120', 120'', 120''', 140 and/or 140' may be configured to attract particular materials such as B. in some embodiments, the nonmagnetic insertion layer 120, 120', 120'', 140 and/or 140' may be desired to include Bi, W, I, Zn, Nb, Ag, Cd, Hf, and/or Zr. This is particularly true if the magnetic layers 110/130, 110'/130', 110''/130''/150, and/or 110'''/130'''/150 include materials such as B. for example, the one or more magnetic layers of the magnetic substructure 100, 100A, 100', 100'', and/or 100''' may take the form $Co_{x1}Fe_{x2}Ni_{x3}Mn_{x4}M1_{y1}M2_{y2}$, where x1, x2, x3, y1, y2 and y3 are each at least zero and not more than one, wherein x1+x2+x3+x4+y1+y2=1 and M1 and M2 are selected from Ta, B, Zr, Cr, V, Al, Be, Ti, Au, Hf, Pd, Pt, Bi and Ga.

As described above with respect to FIGS. 3A-3C, use of such materials in magnetic substructure of the pinned layer 210''', free layer 230''' and/or pinned layer 250 may reduce or prevent diffusion of materials such as B to the interfaces between the layers 204''' and 210''', 210''' and 220''', 220''' and 230''', 230''' and 250, 250 and 260 and/or 260 and 270''. Instead, such material(s) may tend to move toward the center of the layers 210''', 230''' and/or 260. As a result, degradation of the perpendicular magnetic anisotropy and/or magnetoresistance of the magnetic junction 200''' may be diminished or prevented. Thus, performance of the magnetic junction 200''' may be improved.

Figure 11:
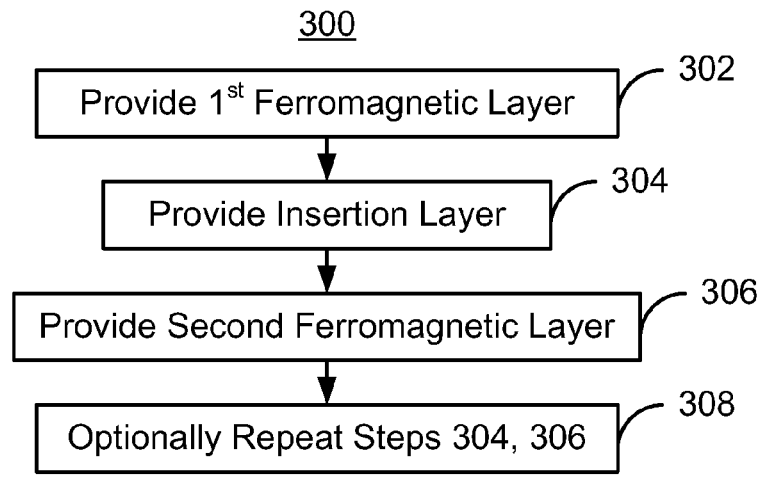
FIG. 11 depicts an exemplary embodiment of a method for providing a magnetic substructure.

FIG. 11 depicts an exemplary embodiment of a method 300 for fabricating magnetic substructure. For simplicity, some steps may be omitted or combined. The method 300 is described in the context of the magnetic substructure 100. However, the method 300 may be used on other magnetic substructure such as the substructure 100', 100'' and/or 100'''. Further, the method 300 may be incorporated into fabrication of magnetic memories. Thus the method 300 may be used in manufacturing a STT-MRAM or other magnetic memory.

The ferromagnetic layer 110 is provided, via step 302. Step 302 may include depositing the desired materials at the desired thickness of the ferromagnetic layer 110. The insertion layer 120 is provided, via step 304. Step 304 may include depositing the desired nonmagnetic materials. In addition, the desired thickness of material may be deposited in step 304. The second ferromagnetic layer is provided, via step 306. Note that steps 302, 304 and 306 may include varying the concentrations of the nonmagnetic and ferromagnetic materials while co-depositing such materials. As a result, the method 300 may provide the layers 110A, 120A and 130A, which correspond to variations in concentration instead of layers with clearly defined interfaces. The steps of providing the insertion layer and another ferromagnetic layer are optionally repeated, via step 308. Thus, the magnetic substructure having the desired number of ferromagnetic layers and insertion layers may be provided. Thus, the magnetic substructure 100, 100A, 100', 100'', and/or 100''' is formed. Consequently, the benefits of the magnetic substructure may be achieved.

Figure 12:
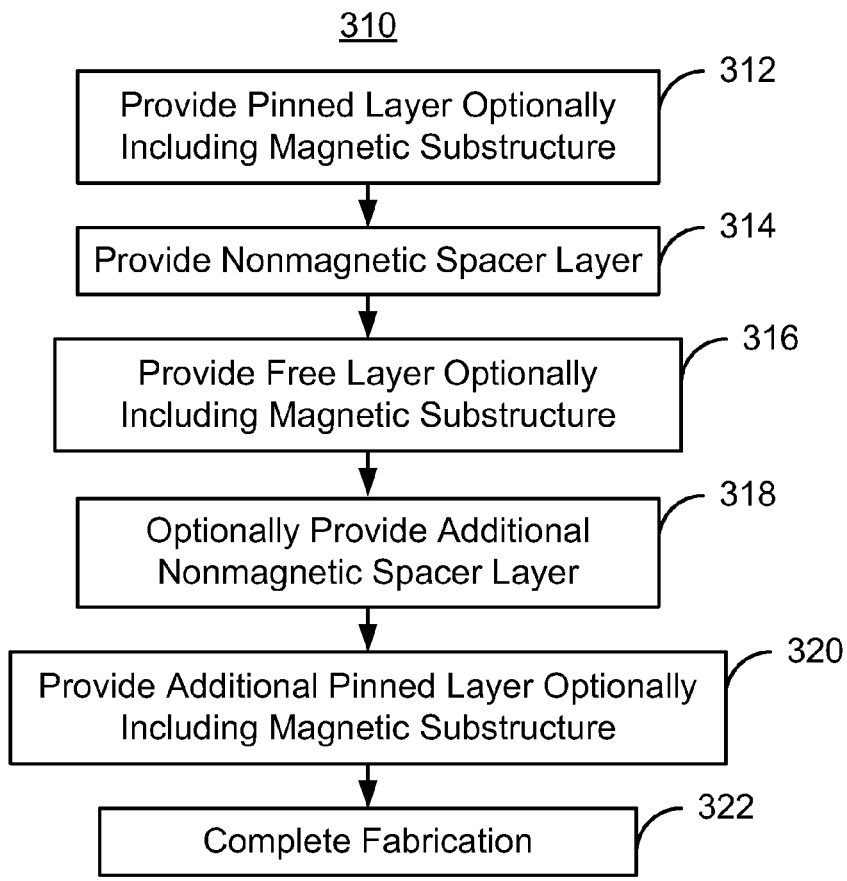
FIG. 12 an exemplary embodiment of a method for fabricating a magnetic junction including a magnetic substructure.

FIG. 12 depicts an exemplary embodiment of a method 310 for fabricating magnetic substructure. For simplicity, some steps may be omitted or combined. The method 310 is described in the context of the magnetic junction 200. However, the method 310 may be used on other magnetic junctions such as the junctions 200', 200'' and/or 200'''. Further, the method 310 may be incorporated into fabrication of magnetic memories. Thus the method 310 may be used in manufacturing a STT-MRAM or other magnetic memory. The method 310 may commence after the seed layer(s) 202 and optional pinning layer 204 are provided.

The pinned layer 210 is provided, via step 312. Step 312 may include depositing the desired materials at the desired thickness of the pinned layer 210. Further, step 312 may include providing a SAF. In other embodiments, the magnetic substructure 100, 100A, 100', 100'', and/or 100''' may be provided. The nonmagnetic layer 220 is provided, via step 314. Step 314 may include depositing the desired nonmagnetic materials, including but not limited to crystalline MgO. In addition, the desired thickness of material may be deposited in step 314.

The free layer 230 optionally including the magnetic substructure 100, 100A, 100', 100'', and/or 100''' is provided, via step 316. An additional nonmagnetic spacer layer, such as layer 250 may be provided, via step 318. An additional pinned layer, such as the layer 260, may be optionally provided, via step 320. Fabrication may then be completed, via step 322. For example, the capping layer 240 may be provided. In other embodiments, optional additional pinning layer 204 may be provided. In some embodiments, in which the layers of the magnetic junction are deposited as a stack, then defined, step 322 may include defining the magnetic junction 200, performing anneals, or otherwise completing fabrication of the magnetic junction 200/200'. Further, if the magnetic junction 200/200' is incorporated into a memory, such as an STT-MRAM, step 322 may include providing contacts, bias structures, and other portions of the memory. Consequently, the benefits of the magnetic junction may be achieved.

Figure 13:
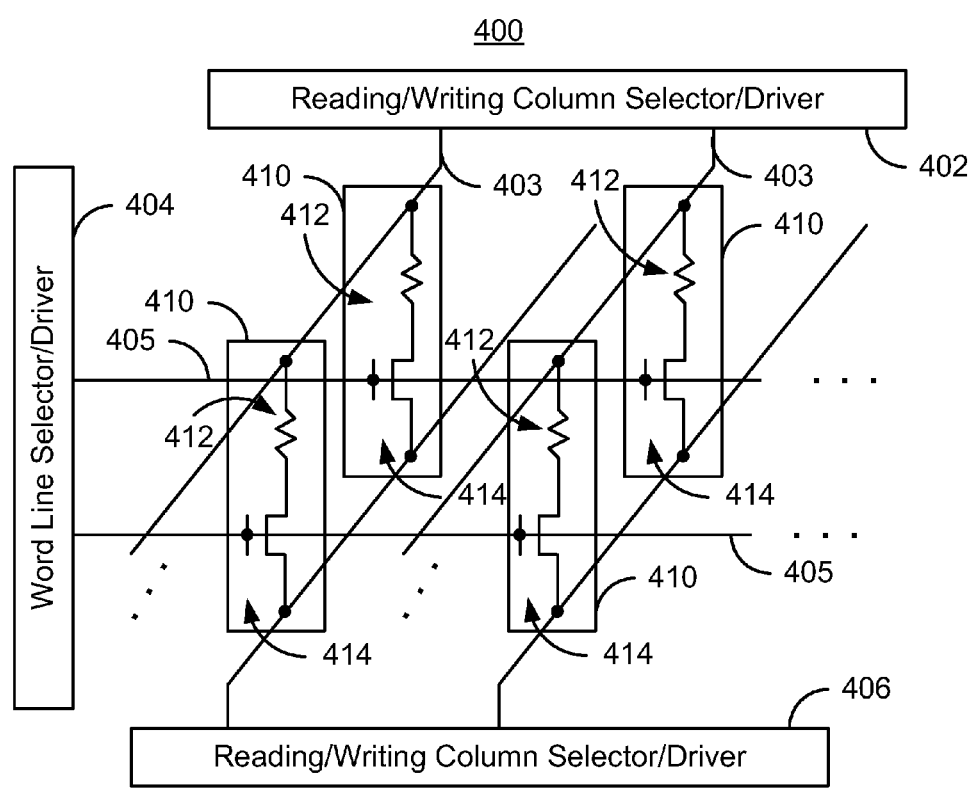
FIG. 13 depicts an exemplary embodiment of a memory utilizing magnetic junctions in the memory element(s) of the storage cell(s).

Further, the magnetic junctions 200, 200', 200", and/or 200'" may be used in a magnetic memory. FIG. 13 depicts an exemplary embodiment of one such memory 400. The magnetic memory 400 includes reading/writing column select drivers 402 and 406 as well as word line select driver 404. Note that other and/or different components may be provided. The storage region of the memory 400 includes magnetic storage cells 410. Each magnetic storage cell includes at least one magnetic junction 412 and at least one selection device 414. In some embodiments, the selection device 414 is a transistor. The magnetic junctions 412 may be one of the magnetic junctions 200, 200', 200", and/or 200'". Although one magnetic junction 412 is shown per cell 410, in other embodiments, another number of magnetic junctions 412 may be provided per cell. As such, the magnetic memory 400 may enjoy the benefits described above, such as lower soft error rate and a low critical switching current.

Various magnetic substructures 100, 100', 100", and 100'" as well as magnetic junctions 200, 200', 200", and 200'" have been disclosed. Note that various features of the magnetic substructures 100, 100', 100", and 100'" and the magnetic junctions 200, 200', 200", and 200'" may be combined. Thus, one or more of the benefits of the magnetic substructures 100, 100', 100", and 100'" and the magnetic junctions 200, 200', 200", and 200'" such as reduced write error rate, a perpendicular anisotropy, thermal stability, and/or scalability may be achieved.

A method and system for providing a magnetic substructure, a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic junction for use in a magnetic device comprising:
   a pinned layer;
   a nonmagnetic spacer layer; and
   a free layer, the nonmagnetic spacer layer residing between the pinned layer and the free layer;
   wherein the magnetic junction is configured such that the free layer is switchable between a plurality of stable magnetic states when a write current is passed through the magnetic junction; and
   wherein at least one of the pinned layer and the free layer includes a magnetic substructure, the magnetic substructure including at least two magnetic layers interleaved with at least one insertion layer, each of the at least one insertion layer including at least one of Bi, W, I, Zn, Nb, Ag, Cd, Hf, Os, Mo, Ca, Hg, Sc, Y, Sr, Mg, Ti, Ba, K, Na, Rb, Pb, and Zr, the at least two magnetic layers being magnetically coupled;
   wherein the at least two magnetic layers include a first magnetic and a second magnetic layer, at least one of the first magnetic layer and the second magnetic layer including B; and
   wherein the at least one of the first magnetic layer and the second magnetic layer includes $Co_{x1}Fe_{x2}Ni_{x3}Mn_{x4}M1_{y1}M2_{y2}$, where x1, x2, x3, y1, y2 and y3 are each at least 0 and not more than one and wherein x1+x2+x3+x4+y1+y2=1 and M1 and M2 are selected from Ta, B, Zr, Cr, V, Al, Be, Ti, Au, Hf, Pd, Pt, Bi and Ga.

2. The magnetic junction of claim 1 wherein the nonmagnetic insertion layer is not more than five Angstroms thick.

3. The magnetic junction of claim 1 further comprising:
   a first insulating spacer layer and a second insulating spacer layer, the magnetic substructure residing between the first insulating spacer layer and the second insulting spacer layer.

4. The magnetic junction of claim 3 wherein each of the first insulating spacer layer and the second insulating spacer layer includes crystalline MgO.

5. The magnetic junction of claim 4 wherein the nonmagnetic spacer layer is the first insulating spacer layer.

6. The magnetic junction of claim 5 further comprising:
   an additional pinned layer, the second insulating spacer layer being between the additional pinned layer and the free layer.

7. The magnetic junction of claim 6 wherein the additional pinned layer includes an additional magnetic substructure having at least two additional magnetic layers interleaved with at least one additional insertion layer, each of the at least one additional insertion layer including at least one of Bi, W, I, Zn, Nb, Ag, Cd, Hf, Os, Mo, Ca, Hg, Sc, Y, Sr, Mg, Ti, Ba, K, Na, Rb, Pb, and Zr.

8. The magnetic junction of claim 1 wherein the free layer includes the magnetic substructure.

9. The magnetic junction of claim 8 wherein the free layer includes a polarization enhancement layer.

10. The magnetic junction of claim 1 wherein the pinned layer includes the magnetic substructure.

11. The magnetic junction of claim 1 wherein the at least two magnetic layers and the at least one insertion layer correspond to a single layer having varying concentration of a plurality of constituents, the nonmagnetic insertion layer corresponding to at least one concentration of the at least one of Bi, W, I, Zn, Nb, Ag, Cd, Hf, Os, Mo, Ca, Hg, Sc, Y, Sr, Mg, Ti, Ba, K, Na, Rb, Pb, and Zr, the at least one concentration having at least one global peak corresponding to the nonmagnetic insertion layer.

12. The magnetic junction of claim 11 wherein the global peak corresponds to a total concentration of all of the at least one of Bi, W, I, Zn, Nb, Ag, Cd, Hf, Os, Mo, Ca, Hg, Sc, Y, Sr, Mg, Ti, Ba, K, Na, Rb, Pb, and Zr, being at least fifty percent.

13. A magnetic junction for use in a magnetic device comprising:
   a pinned layer;
   a nonmagnetic spacer layer; and
   a free layer, the nonmagnetic spacer layer residing between the pinned layer and the free layer;
   wherein the magnetic junction is configured such that the free layer is switchable between a plurality of stable magnetic states when a write current is passed through the magnetic junction;
   wherein at least one of the pinned layer and the free layer includes a magnetic substructure, the magnetic substructure including at least two magnetic layers interleaved with at least one insertion layer, the at least one insertion layer including a nonmagnetic material, the at least two magnetic layers being magnetically coupled, the at least two magnetic layers include a first magnetic and a second magnetic layer;

wherein the at least one of the first magnetic layer and the second magnetic layer includes $Co_{x1}Fe_{x2}Ni_{x3}Mn_{x4}M1_{y1}M2_{y2}$, where x1, x2, x3, y1, y2 and y3 are each at least 0 and not more than one and wherein x1+x2+x3+x4+y1+y2=1 and M1 and M2 are selected from Ta, B, Zr, Cr, V, Al, Be, Ti, Au, Hf, Pd, Pt, Bi and Ga.

14. A magnetic memory comprising:

a plurality of magnetic storage cells, each of the plurality of magnetic storage cells including at least one magnetic junction, the at least one magnetic junction including a pinned layer, a nonmagnetic spacer layer, and a free layer, the nonmagnetic spacer layer residing between the pinned layer and the free layer, the magnetic junction being configured such that the free layer is switchable between a plurality of stable magnetic states when a write current is passed through the magnetic junction, at least one of the pinned layer and the free layer includes a magnetic substructure, the magnetic substructure including at least two magnetic layers interleaved with at least one insertion layer, each of the at least one insertion layer including at least one of Bi, W, I, Zn, Nb, Ag, Cd, Hf, Os, Mo, Ca, Hg, Sc, Y, Sr, Mg, Ti, Zn, Ba, K, Na, Rb, Pb, and Zr, the at least two magnetic layers being magnetically coupled, the at least two magnetic layers including a first magnetic and a second magnetic layer, at least one of the first magnetic layer and the second magnetic layer including B, the at least one of the first magnetic layer and the second magnetic layer including $Co_{x1}Fe_{x2}Ni_{x3}Mn_{x4}M1_{y1}M2_{y2}$, where x1, x2, x3, y1, y2 and y3 are each at least 0 and not more than one and wherein x1+x2+x3+x4+y1+y2=1 and M1 and M2 are selected from Ta, B, Zr, Cr, V, Al, Be, Ti, Au, Hf, Pd, Pt, Bi and Ga; and a plurality of bit lines.

15. The magnetic memory of claim 14 wherein the nonmagnetic insertion layer is not more than five Angstroms thick.

16. The magnetic memory of claim 14 wherein the magnetic substructure further includes:

a first insulating spacer layer and a second insulating spacer layer, the magnetic substructure residing between the first insulating spacer layer and the second insulting spacer layer.

17. The magnetic memory of claim 16 wherein each of the at least one magnetic junction further includes:

an additional pinned layer, the second insulating spacer layer being between the additional pinned layer and the free layer.

18. A magnetic memory comprising:

a plurality of magnetic storage cells, each of the plurality of magnetic storage cells including at least one magnetic junction, the at least one magnetic junction including a pinned layer, a nonmagnetic spacer layer, and a free layer, the nonmagnetic spacer layer residing between the pinned layer and the free layer, the magnetic junction being configured such that the free layer is switchable between a plurality of stable magnetic states when a write current is passed through the magnetic junction, at least one of the pinned layer and the free layer includes a magnetic substructure, the magnetic substructure including at least two magnetic layers interleaved with at least one insertion layer, the at least one insertion layer including a nonmagnetic material, the at least two magnetic layers being magnetically coupled, wherein the at least two magnetic layers include a first magnetic layer and a second magnetic layer, at least one of the first magnetic layer and the second magnetic layer includes $Co_{x1}Fe_{x2}Ni_{x3}Mn_{x4}M1_{y1}M2_{y2}$, where x1, x2, x3, y1, y2 and y3 are each at least 0 and not more than one and wherein x1+x2+x3+x4+y1+y2=1 and M1 and M2 are selected from Ta, B, Zr, Cr, V, Al, Be, Ti, Au, Hf, Pd, Pt, Bi and Ga; and a plurality of bit lines.

* * * * *